(12) United States Patent
Wu et al.

(10) Patent No.: US 12,283,339 B2
(45) Date of Patent: Apr. 22, 2025

(54) DATA TRANSMISSION CIRCUIT AND MEMORY DEVICE

(71) Applicant: ChangXin Memory Technologies, Inc., Hefei (CN)

(72) Inventors: Xianjun Wu, Hefei (CN); Weibing Shang, Hefei (CN); Xiaoqing Shi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/796,745

(22) PCT Filed: Apr. 18, 2022

(86) PCT No.: PCT/CN2022/087372
§ 371 (c)(1),
(2) Date: Aug. 1, 2022

(87) PCT Pub. No.: WO2023/019988
PCT Pub. Date: Feb. 23, 2023

(65) Prior Publication Data
US 2024/0265952 A1    Aug. 8, 2024

(30) Foreign Application Priority Data

Aug. 20, 2021    (CN) .......................... 202110963315.6

(51) Int. Cl.
*G11C 7/08*    (2006.01)
*G11C 7/10*    (2006.01)

(52) U.S. Cl.
CPC .............. *G11C 7/08* (2013.01); *G11C 7/1096* (2013.01)

(58) Field of Classification Search
CPC ................................ G11C 7/08; G11C 7/1096
See application file for complete search history.

(56) References Cited

U.S. PATENT DOCUMENTS

| 5,729,159 A | 3/1998 | Gersbach |
| 9,378,780 B1 * | 6/2016 | Chang ...................... G11C 7/08 |

FOREIGN PATENT DOCUMENTS

CN    1380695 A    11/2002

OTHER PUBLICATIONS

Extended European search report in U.S. Appl. No. 22/857,306, mailed on Sep. 19, 2024.

* cited by examiner

*Primary Examiner* — Xiaochun L Chen
(74) *Attorney, Agent, or Firm* — Syncoda LLC; Feng Ma

(57) ABSTRACT

The disclosed data transmission circuit and a memory include a sense amplifier circuit, a first sub-discharge path, a second sub-discharge path, and a discharge adjustment unit. The sense amplifier circuit generate amplified signals based on two terminals. The first sub-discharge path, in the read state, discharges at the first terminal to the discharge terminal based on the first data line signal; the second sub-discharge path, in reading state, discharges at the second terminal to the discharge terminal based on the discharge adjustment signa. The discharge adjustment unit is electrically connected to the second sub-discharge path and the control signal, but is not connected to the first sub-discharge path, and is used for generating the discharge adjustment signal based on the control signal, to adjust the discharge capacity of the second sub-discharge path. The present disclosure improves the anti-interference ability and data transmission efficiency of the data transmission circuit.

19 Claims, 16 Drawing Sheets

DATA TRANSMISSION CIRCUIT AND MEMORY DEVICE

CROSS REFERENCE TO RELATED APPLICATIONS

This disclosure claims the priority of the Chinese patent application with the application number 202110963315.6, entitle "Data Transmission Circuit and Memory Device" filed with the China National Intellectual Property Administration on Aug. 20, 2021, the entire contents of which are incorporated by reference in this disclosure.

TECHNICAL FIELD

The present disclosure relates to the technical field of semiconductor storage devices, and in particular, to a data transmission circuit and a memory device.

BACKGROUND

Semiconductor memory devices are typically arranged in large two-dimensional arrays of memory cells. The memory cells of each row can be selected by row lines (word lines), and the memory cells of each column can be selected by column lines (bit lines). The memory cell located at the intersection of a word line and a bit line is used for storing corresponding information, and is electrically connected to the corresponding sense amplifier, and the sense amplifier is used for reading the information stored in the memory cell, and outputting after amplification.

However, due to the influence of noise signals in the data transmission circuit of the conventional semiconductor memory device, the accuracy of the actual transmission signal is lower than expected.

SUMMARY

According to various embodiments of the present disclosure, a data transmission circuit and a memory are provided.

According to some embodiments, an embodiments of the present disclosure provides a data transmission circuit, including a sense amplifier circuit, a first sub-discharge path, a second sub-discharge path, and a discharge adjustment unit, the sense amplifier circuit is used to generates an amplified signal based on a signal at a first terminal and a signal at a second terminal; the first sub-discharge path is electrically connected to the first terminal of the sense amplifier circuit and the first data line, and is used for reading according to the first data line in the read state. The signal of the sense amplifier circuit discharges the first terminal of the sense amplifier circuit to the discharge end; the second sub-discharge path is electrically connected to the second terminal of the sense amplifier circuit and the discharge adjustment signal, and is used to adjust the discharge according to the discharge state when reading the state. The signal discharges the second terminal of the sense amplifier circuit to the discharge end; the discharge adjustment unit is electrically connected to the second sub-discharge path and the control signal, and is not electrically connected to the first sub-discharge path, and is used to generate discharge according to the control signal. The signal is adjusted to adjust the discharge capability of the second sub-discharge path.

According to some embodiments, the control signal includes a first sub-control signal, and the discharge adjustment signal includes a first sub-discharge adjustment signal; the discharge adjustment unit includes a first sub-discharge adjustment circuit, the first sub-discharge adjustment circuit and the first sub-control signal and the first sub-discharge adjustment circuit. The first ends of the two sub-discharge paths are both electrically connected, and are used for providing the first sub-discharge adjustment signal to the second sub-discharge path according to the first sub-control signal.

According to some embodiments, the control signal further includes a second sub-control signal, the discharge adjustment signal further includes a second sub-discharge adjustment signal; the discharge adjustment unit further includes a second sub-discharge adjustment circuit, the second sub-discharge adjustment circuit and the second sub-control Both the signal and the second terminal of the second sub-discharge path are electrically connected for providing the second sub-discharge adjustment signal to the second sub-discharge path according to the second sub-control signal.

According to some embodiments, the first sub-discharge regulating circuit includes a first transistor, a second transistor and a first energy storage unit, the first transistor is configured to have a source electrically connected to the first voltage and a gate to the first sub-control signal electrically connected; the second transistor is configured such that the source is electrically connected to the second voltage, the drain is electrically connected to the drain of the first transistor and the first terminal of the second sub-discharge path, and the gate is electrically connected to the first sub-control signal Electrical connection; the first energy storage unit is electrically connected to the drain of the first transistor and the drain of the second transistor.

According to some embodiments, the second sub-discharge regulating circuit includes a third transistor, a fourth transistor and a second energy storage unit, the third transistor is configured to have a source electrically connected to the first voltage and a gate to the second sub-control signal electrically connected; the fourth transistor is configured such that the source is electrically connected to the second voltage, the drain is electrically connected to the drain of the third transistor and the second terminal of the second sub-discharge path, and the gate is electrically connected to the second sub-control signal electrical connection; the second energy storage unit is electrically connected to the drain of the third transistor and the drain of the fourth transistor.

According to some embodiments, the first energy storage unit includes a first MOS transistor and/or a capacitor, and the first MOS transistor is configured such that both the source and the drain are electrically connected to the first voltage node, and the gate is connected to the drain of the first transistor. The electrode, the drain of the second transistor and the first terminal of the second sub-discharge path are all electrically connected; the capacitor is configured such that the first terminal is electrically connected to the first voltage node, and also electrically connected to the drain of the first transistor, the drain of second transistor, and the first terminal of the second sub-discharge path.

According to some embodiments, the first voltage node is grounded; or the first voltage node is electrically connected to the first controllable voltage output unit; wherein the first controllable voltage output unit is configured to provide the controllable voltage to the first voltage node according to the received first sub-control signal.

According to some embodiments, the first controllable voltage output unit includes a first NOR gate, the first NOR gate is configured such that the output terminal is electrically connected to the first voltage node, and the first input terminal is electrically connected to the first sub-control signal, the second input terminal is electrically connected to both the first sub-discharge path and the second sub-discharge path.

According to some embodiments, the sense amplifier circuit includes an amplifying unit and an output circuit, the amplifying unit is electrically connected to the discharge terminals of the first sub-discharge path and the second sub-discharge path; terminal, the second terminal of the sense amplifier circuit, the second data line and the second complementary data line are all electrically connected; wherein, the sense amplifier circuit is used to send amplified signal, based on the equalization signal, the signals provided by the first sub-discharge path and by the second sub-discharge path, to the second data line and the second complementary data line, wherein the second data line and the second complementary data line transmit mutually inverse data.

According to some embodiments, the sense amplifier circuit further includes a precharge module, and the precharge module is electrically connected to the third terminal of the sense amplifier circuit and the fourth terminal of the sense amplifier circuit for precharging.

According to some embodiments, the output circuit further includes a first sub-output circuit and a second sub-output circuit, the first sub-output circuit is electrically connected to the second terminal of the sense amplifier circuit, the second data line and the second complementary data line, the second sub-output circuit is electrically connected to the first terminal of the sense amplifier circuit, the second data line and the second complementary data line, and is used to output the amplified signal and match the output load of the amplifying unit.

According to some embodiments, the output circuit further includes a first switch unit and a second switch unit, the first terminal of the sense amplifier circuit is electrically connected to the equalization signal through the first switch unit; the second terminal of the sense amplifier circuit is connected through the second switch The unit is electrically connected to the equalized signal.

According to some embodiments, the data transmission circuit further includes a discharge terminal control circuit, the discharge terminal control circuit is electrically connected to the discharge terminals of the first sub-discharge path and the second sub-discharge path, and is used for receiving the read enable signal and complementary equalization according to the received read enable signal. The signal provides a driving voltage to the first sub-discharge path and the second sub-discharge path to control the discharge capacity of the first sub-discharge path and the second sub-discharge path, wherein the complementary equalization signal and the equalization signal are mutually inverse signals.

According to some embodiments, the data transmission circuit further includes a write circuit, the write circuit is electrically connected to the second data line, the write enable signal, the equalization signal and the first data line, and the write circuit is configured to send the first data line to the first data line according to the write enable signal and the equalization signal data line to write data.

According to some embodiments, the amplifying unit includes a fifth transistor, a sixth transistor, a seventh transistor and an eighth transistor, the fifth transistor is configured to have a source electrically connected to the third voltage; and the sixth transistor is configured to have a source connected to the third voltage. The second voltage node is electrically connected, and the drain is electrically connected to the drain of the fifth transistor; the seventh transistor is configured such that the source is electrically connected to the third voltage, the drain is electrically connected to the gate of the fifth transistor, and the gate is electrically connected to The drain of the fifth transistor is electrically connected; the eighth transistor is configured such that the source is electrically connected to the third voltage node, the drain is electrically connected to the drain of the seventh transistor and the gate of the sixth transistor, and the gate is electrically connected to the third voltage node. The drains of the five transistors are electrically connected.

According to some embodiments, the first sub-output circuit includes a ninth transistor, a tenth transistor, an eleventh transistor, and a twelfth transistor, and the ninth transistor is configured to have a source connected to the third voltage and a drain connected to the second transistor. The complementary data line is electrically connected, the gate is electrically connected to the drain of the seventh transistor; the tenth transistor is configured such that the drain is electrically connected to the drain of the ninth transistor, the gate is electrically connected to the drain of the seventh transistor and the gates of the transistors are all electrically connected; the eleventh transistor is configured as: the source is grounded, the drain is electrically connected to the source of the tenth transistor, and the gate is electrically connected to the second data line; the twelfth transistor is configured as: the source electrode is electrically connected to the third voltage, the drain is electrically connected to the second complementary data line and the drain of the ninth transistor, and the gate is electrically connected to the second data line.

According to some embodiments, the second sub-output circuit includes a thirteenth transistor, a fourteenth transistor, a fifteenth transistor, a sixteenth transistor, a seventeenth transistor, and an eighteenth transistor, the thirteenth transistor being configured as: a source The electrode is electrically connected to the third voltage, the drain is electrically connected to the second data line, and the gate is electrically connected to the drain of the fifth transistor; the fourteenth transistor is configured such that the drain is electrically connected to the drain of the thirteenth transistor, the gate is electrically connected to the drain of the fifth transistor and the gate of the thirteenth transistor; the fifteenth transistor is configured such that the drain is electrically connected to the source of the fourteenth transistor, and the gate is electrically connected to the second complementary data line; the sixteenth transistor is configured with: the source is grounded, the drain is electrically connected with the source of the fifteenth transistor, and the gate is electrically connected with the reset signal; the seventeenth transistor is configured with the source and the third voltage is electrically connected, the drain is electrically connected to the second data line, the gate is electrically connected to the second complementary data line and the gate of the fifteenth transistor; the eighteenth transistor is configured such that the source is electrically connected to the third voltage, the drain is electrically connected to the second data line, and the gate is electrically connected to the reset signal and the gate of the sixteenth transistor.

According to some embodiments, the output circuit further includes a first inverter, a second NOR gate, a second inverter and a third NOR gate, the first inverter is configured as: an input terminal is electrically connected to a drain of the seventh transistor; the second NOR gate is configured as: the first input terminal is electrically connected to the output terminal of the first inverter, the second input terminal is electrically connected to the second complementary data line, and the output terminal is electrically connected to the second data line connected; the second inverter is configured to: the input terminal is electrically connected to the drain of the fifth transistor; the third NOR gate is configured to: the first input terminal is electrically connected to the second data line, and the second input terminal is electrically connected to the fifth transistor. The output ends of the two inverters are electrically connected, and the output ends are electrically connected with the second complementary data line.

According to some embodiments, the write circuit includes a nineteenth transistor, a twentieth transistor, a fourth NOR gate, a fifth NOR gate, a first NAND gate, a first AND gate, and a third inverter, the nineteenth transistor is configured such that the source is electrically connected to the third voltage, and the drain is electrically connected to the first data line; the twentieth transistor is configured such that the source is grounded, the drain is connected to the drain of the nineteenth transistor and the first data line The lines are all electrically connected; the fourth NOR gate is configured to: the output terminal is electrically connected to the gate of the nineteenth transistor; the fifth NOR gate is configured to: the output terminal is electrically connected to the gate of the twentieth transistor; a NAND gate is configured as: the output terminal is electrically connected to the first input terminal of the fifth NOR gate, the first input terminal is electrically connected to the write enable signal, and the second input terminal is electrically connected to the equalization signal; the first AND gate is configured that the output terminal is electrically connected to the second input terminal of the fourth NOR gate, the first input terminal is electrically connected to the write enable signal, and the second input terminal is electrically connected to the second input terminal and the second input terminal of the fifth NOR gate. The data lines are all electrically connected; the third inverter is configured such that the output terminal is electrically connected to the first input terminal of the fourth NOR gate, and the input terminal is electrically connected to the equalization signal.

According to some embodiments, another embodiment of the present disclosure provides a memory device including the data transmission circuit described in any one of the embodiments of the present disclosure.

Embodiments of the present disclosure may/at least have the following advantages:

In the data transmission circuit and the memory provided by the embodiments of the present disclosure, the discharge adjustment unit is configured to be electrically connected to the second sub-discharge path and the control signal, and not to the first sub-discharge path, so that the discharge adjustment unit is configured according to the control signal. A discharge regulation signal is generated to adjust the discharge capacity of the second sub-discharge path, improve the data transmission efficiency of the data transmission circuit, and avoid the impedance and noise signals provided by the circuit connected to the first sub-discharge path via the first data line. The effect of the amplifier circuit.

In addition, in the embodiment of the present disclosure, the first sub-discharge adjustment circuit can provide the first sub-discharge adjustment signal to the second sub-discharge path according to the first sub-control signal, so as to adjust the discharge capacity of the second sub-discharge path, and improve the performance of the data transmission circuit. Data transmission efficiency, and avoid the impact of the impedance and noise signal provided by the circuit connected to the first sub-discharge path via the first data line on the sense amplifier circuit; the second sub-discharge adjustment circuit can be based on the second sub-control signal. The two sub-discharge paths provide the second sub-discharge adjustment signal, which cooperates with the first sub-discharge adjustment signal to adjust the discharge capacity of the second sub-discharge path, improves the data transmission efficiency of the data transmission circuit, and avoids communication with the first sub-discharge via the first data line. The impact of the impedance and noise signal provided by the circuit connected by the path on the sense amplifier circuit; by setting the first energy storage unit to store the energy released by the first sub-discharge regulating circuit, the discharge efficiency of the first sub-discharge regulating circuit can be improved, and the The impedance and the noise signal provided by the circuit connected to the first sub-discharge path via the first data line affect the sense amplifier circuit.

In conclusion, the embodiments of the present disclosure provide a data transmission circuit and a memory device with a stronger anti-interference capability and a higher data transmission efficiency.

The details of one or more embodiments of the disclosed embodiments are set forth in the accompanying drawings and the description below. Other features, objects, and advantages of embodiments of the present disclosure will be apparent from the description, drawings, and claims.

BRIEF DESCRIPTION OF THE DRAWINGS

In order to illustrate the technical solutions in the embodiments of the present disclosure more clearly, the following briefly introduces the accompanying drawings used in the description of the embodiments. Obviously, the accompanying drawings in the following description are only some embodiments of the present disclosure. For those of ordinary skill in the art, other drawings can also be obtained from these drawings without creative effort.

FIG. 2c is a type of schematic circuit schematic diagram according to FIG. 2a;

FIG. 2e is another type of schematic circuit diagram according to FIG. 2a;

DETAILED DESCRIPTION OF THE PREFERRED EMBODIMENTS

In order to facilitate the understanding of the embodiments of the present disclosure, a more comprehensive description of the embodiments of the present disclosure will be made below with reference to the related drawings. Preferred embodiments of the present disclosure are shown in the accompanying drawings. However, the present disclosure may be embodied in many different forms and is not limited to the embodiments described herein. Rather, these embodiments are provided so that this disclosure will be thorough and complete.

Unless otherwise defined, all technical and scientific terms used herein have the same meaning as commonly understood by one of ordinary skill in the art to which this disclosure belongs. The terms used herein in the specification of the present disclosure are for the purpose of describing specific embodiments only, and are not intended to limit the present disclosure. Additionally, certain terms used throughout the specification and the claims that follow refer to specific elements. Those skilled in the art will understand that manufacturers may refer to elements by different names. This document does not intend to distinguish between components with different names but the same function. In the following description and examples, the terms "comprising" and "including" are used open-ended and should therefore be read as "including, but not limited to . . . ". Likewise, the term "connected" is intended to express an indirect or direct electrical connection. Accordingly, if one device is connected to another device, the connection can be made through a direct electrical connection, or through an indirect electrical connection between the other device and the connector.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Figure 1:
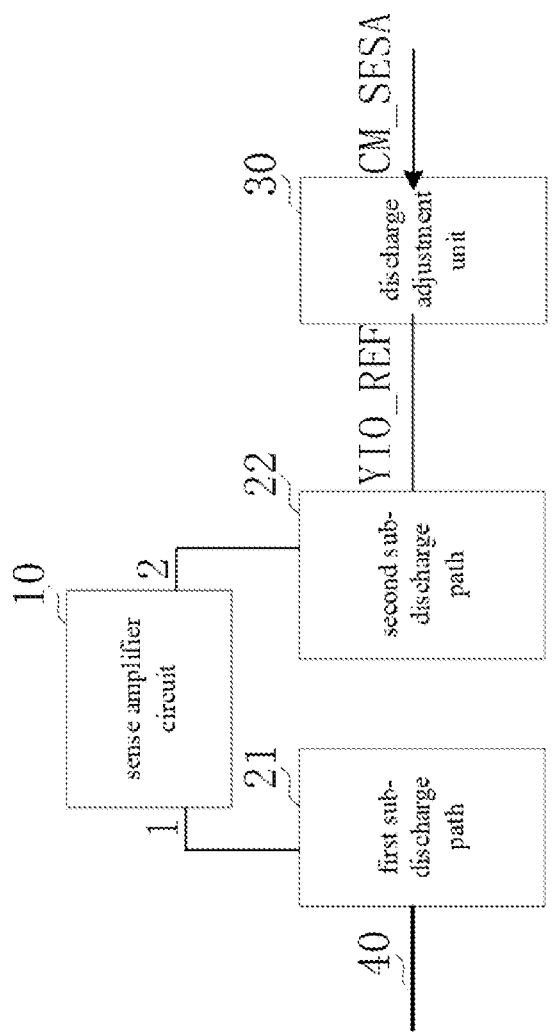
FIG. 1 is a block diagram of a data transmission circuit provided in the first embodiment of the present disclosure.

As an example, please refer to FIG. 1, in one embodiment of the present disclosure, a data transmission circuit is provided, including a sense amplifier circuit 10, a first sub-discharge path 21, a second sub-discharge path 22 and a discharge adjustment unit 30, the sense amplifier circuit 10 is used to generate an amplified signal according to the signal of the first terminal 1 and the signal of the second terminal 2; the first sub-discharge path 21 and the first terminal 1 of the sense amplifier circuit 10 and the first data line 40 are electrically connected to discharge the first terminal 1 of the sense amplifier circuit 10 according to the signal of the first data line 40 in the read state; the second sub-discharge path 22 is connected to the second terminal of the sense amplifier circuit 10 and the discharge adjustment signal YIO_REF are electrically connected for discharging the second terminal 2 of the sense amplifier circuit 10 according to the discharge adjustment signal YIO_REF in the read state; the discharge adjustment unit 30 is connected to the second sub-discharge path 22 but is not electrically connected to the first sub-discharge path 2, and is used to generate a discharge adjustment signal YIO_REF according to the control signal CM_SESA to adjust the discharge capability of the second sub-discharge path 22.

Please continue to refer to FIG. 1, by setting the discharge adjustment unit 30 to be electrically connected to both the second sub-discharge path 22 and the control signal CM_SESA, and not to the first sub-discharge path 21, so that the discharge adjustment unit 30 generates the discharge adjustment signal YIO_REF according to the control signal CM_SESA, to adjust the discharge capacity of the second sub-discharge path 22, to improve the data transmission efficiency of the data transmission circuit, thus to avoid the influence to the amplifier circuit 10 from the impedance and noise signal provided by the circuit connected to the first sub-discharge path 21 via the first data line 40.

Figure 2A:
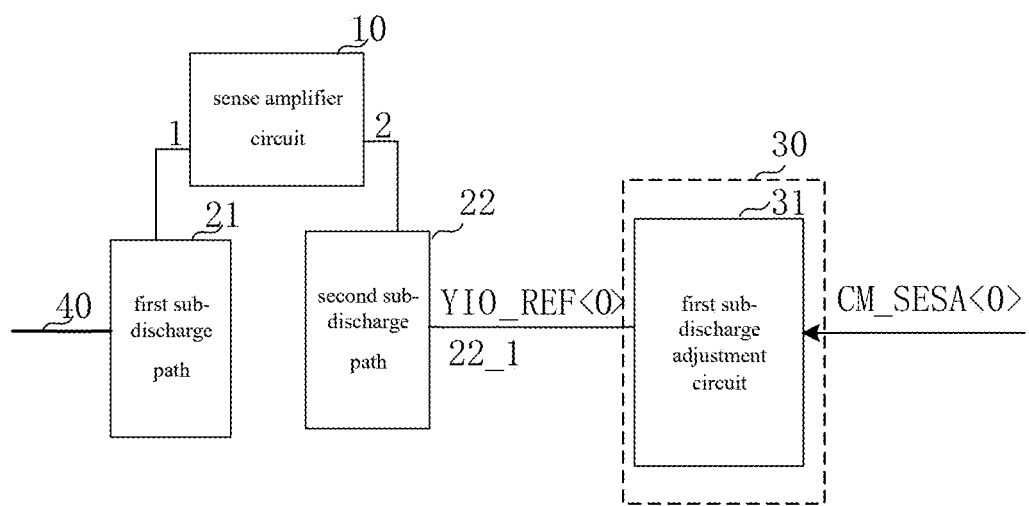
FIG. 2a is a block diagram of a data transmission circuit provided in the second embodiment of the present disclosure.

As an example, please refer to FIG. 2a, in one embodiment of the present disclosure, the control signal CM_SESA includes a first sub-control signal CM_SESA<0>, and the discharge adjustment signal YIO_REF includes a first sub-discharge adjustment signal YIO_REF<0>; the discharge adjustment unit 30 includes a first sub-discharge adjustment circuit 31, the first sub-discharge adjustment circuit 31 is electrically connected to the first sub-control signal CM_SESA<0> and the first terminal 22_1 of the second sub-discharge path 22, and is used for providing the first sub-discharge adjustment signal YIO_REF<0> to the second sub-discharge path 22, based on the signal CM_SESA<0>, to adjust the discharge capability of the second sub-discharge path 22, to improve the data transmission efficiency of the data transmission circuit, thus avoiding the impedance and the noise signal on the sense amplifier circuit 10 from the circuit connecting the line 40 to the first sub-discharge path 21.

Figure 2B:
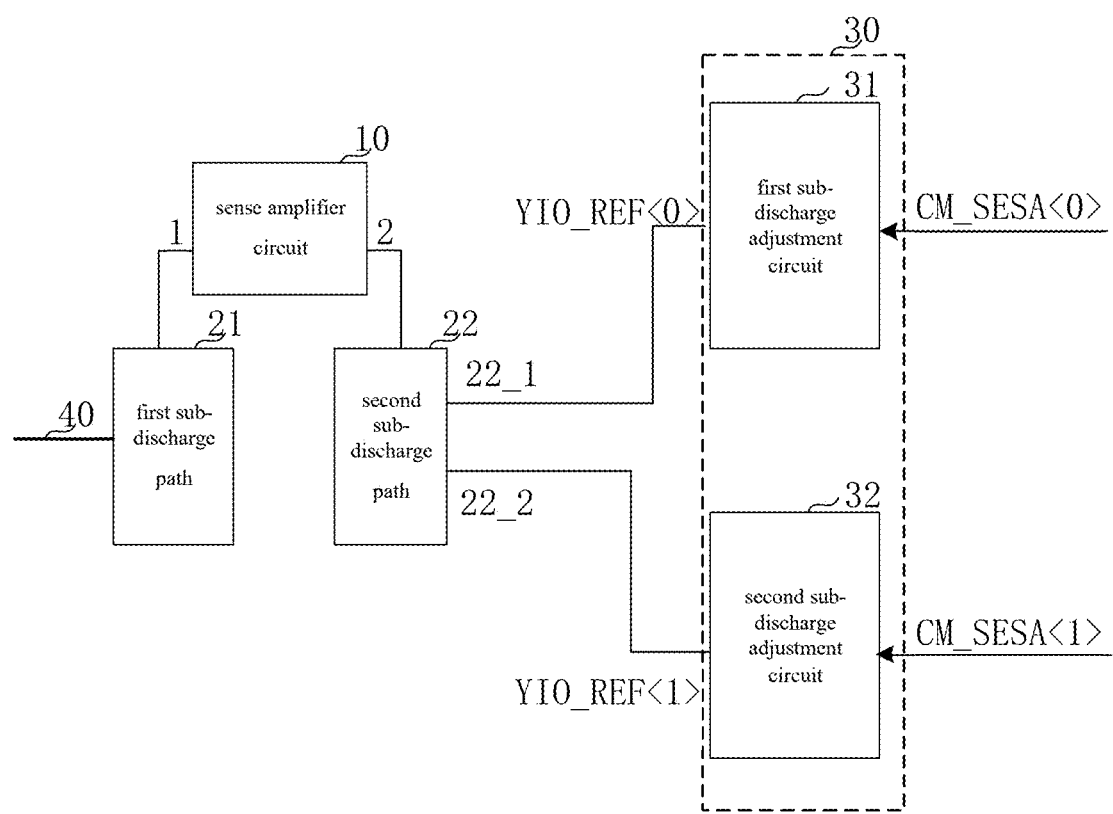
FIG. 2b a block diagram of a data transmission circuit provided in the third embodiment of the present disclosure.

As an example, please refer to FIG. 2b, in one embodiment of the present disclosure, the control signal CM_SESA further includes a second sub-control signal CM_SESA<1>, and the discharge adjustment signal YIO_REF further includes a second sub-discharge adjustment signal YIO_REF<1>; the adjustment unit 30 further includes a second sub-discharge adjustment circuit 32, and the second sub-discharge adjustment circuit 32 is electrically connected to the second sub-control signal CM_SESA<1> and the second terminal 22_2 of the second sub-discharge path 22, and is used for according to the second sub-discharge path 22. The two sub-control signals CM_SESA<1> provide the second sub-discharge adjustment signal YIO_REF<1> to the second sub-discharge path 22, and cooperate with the first sub-discharge adjustment signal YIO_REF<0> to adjust the discharge capacity of the second sub-discharge path 22 to improve the data transmission efficiency of the data transmission circuit, avoiding the influence of the impedance and noise signal provided by the circuit connected with the first sub-discharge path 21 via the first data line 40 to the sense amplifier circuit 10.

Figure 2C:
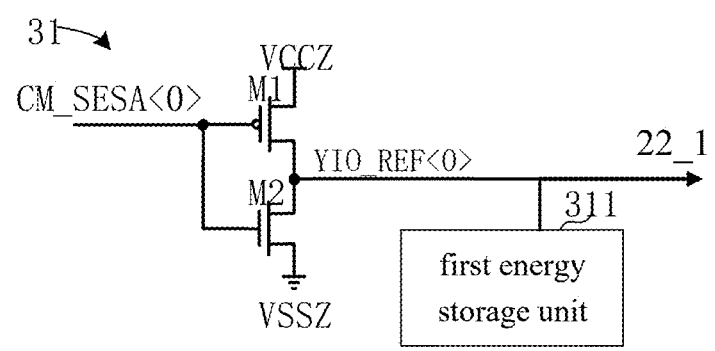

As an example, please refer to FIG. 2c, in one embodiment of the present disclosure, the first sub-discharge regulating circuit 31 includes a first transistor M1, a second transistor M2 and a first energy storage unit 311, and the first transistor M1 is configured as: the source is electrically connected to the first voltage VCCZ, and the gate is electrically connected to the first sub-control signal CM_SESA<0>; the second transistor M2 is configured such that the source is electrically connected to the second voltage VSSZ, and the drain is electrically connected to the drain of the first transistor M1, and the first terminal 22_1 of the second sub-discharge path 22 are electrically connected, and the gate is electrically connected to the first sub-control signal CM_SESA<0>; the first energy storage unit 311 is electrically connected to the drain of the first transistor M1 and the first drains of the two transistors M2 are both electrically connected. By setting the first energy storage unit 311 to store the energy released by the first sub-discharge regulating circuit 31, the discharge efficiency of the first sub-discharging adjustment circuit 31 is improved, and the impedance and the influence of the noise signal on the sense amplifier circuit 10 provided by the circuit connecting the first data line 40 and the first sub-discharging path 21 is avoided.

Figure 2D:
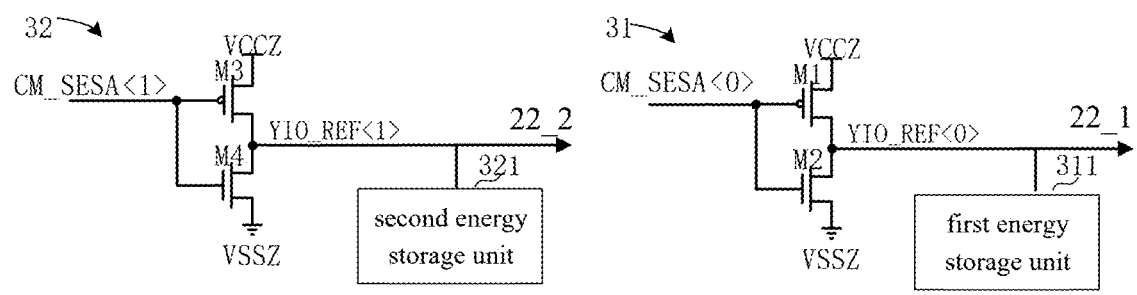
FIG. 2d is a type of schematic circuit diagram of according to FIG. 2b.

As an example, please refer to FIG. 2d, in one embodiment of the present disclosure, the second sub-discharge regulating circuit 32 includes a third transistor M3, a fourth transistor M4 and a second energy storage unit 321, and the third transistor M3 is configured as: The source is electrically connected to the first voltage VCCZ, and the gate is electrically connected to the second sub-control signal CM_SESA<1>; the fourth transistor M4 is configured such that the source is electrically connected to the second voltage VSSZ, and the drain is electrically connected to the third transistor M3's drain of the second sub-discharge path 22, and the second terminal 22_2 of the second sub-discharge path 22 are electrically connected, and the gate is electrically connected to the second sub-control signal CM_SESA<1>; the second energy storage unit 321 is electrically connected to the drain of the third transistor M3 and the drain of the four transistors M4 are all electrically connected. By setting the second energy storage unit 321 to store the energy released by the second sub-discharge regulation circuit 32, the discharge efficiency of the second sub-discharge regulation circuit 32 is improved, avoiding the effect of the impedance and noise signal on the sense amplifier circuit 10 provided by the circuit connecting the first sub-discharge path 21 and the first data line 40.

Figure 2E:
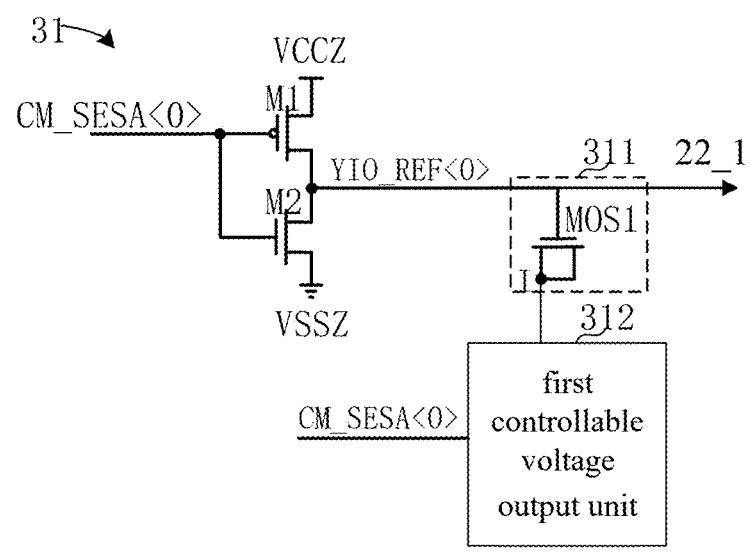

As an example, please refer to FIG. 2e, in an embodiment of the present disclosure, the first energy storage unit 311 includes a first MOS transistor MOS1, and the first MOS transistor MOS1 is configured as: both the source and the drain are connected to the first voltage node, the gate is electrically connected to the drain of the first transistor M1. The drain of the second transistor M2 and the first terminal 22_1 of the second sub-discharge path 22.

As an example, please continue to refer to FIG. 2e, in an embodiment of the present disclosure, the first energy storage unit 311 includes a capacitor (not shown), and the capacitor is configured as: the first terminal is electrically connected to the first voltage node I, the second terminal is electrically connected to the drain of the first transistor M1, the drain of the second transistor M2 and the first terminal 22_1 of the second sub-discharge path 22.

As an example, please continue to refer to FIG. 2e, in an embodiment of the present disclosure, the first voltage node I is electrically connected to the first controllable voltage output unit 312; the first sub-control signal CM_SESA<0> provides a controllable voltage to the first voltage node to adjust the driving voltage of the first energy storage unit 311. In other embodiments of the present disclosure, the first voltage node I may also be set to be grounded.

Figure 2F:
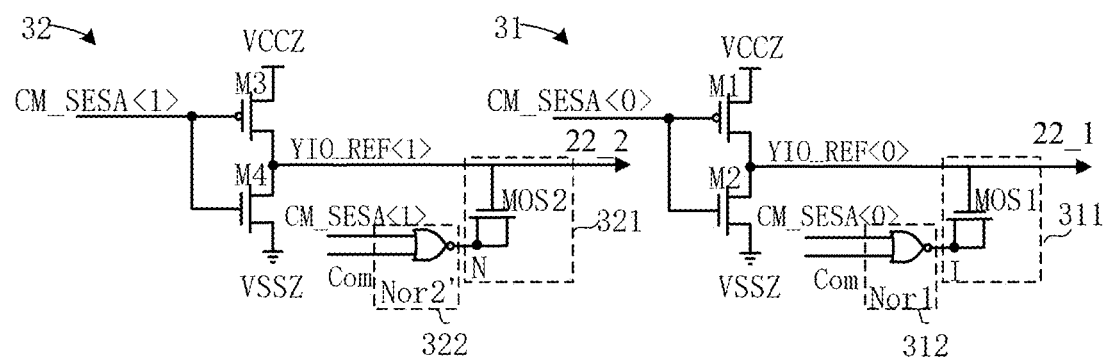
FIG. 2f is another type of schematic circuit diagram according to FIG. 2b.

As an example, please refer to FIG. 2f, in one embodiment of the present disclosure, the first controllable voltage output unit 312 includes a first NOR gate Nor1, and the first NOR gate Nor1 is configured as: an output terminal and a first voltage node I is electrically connected, the first input terminal is electrically connected to the first sub-control signal CM_SESA<0>, and the second input terminal is electrically connected to both the first sub-discharge path 21 and the second sub-discharge path 22.

As an example, please continue to refer to FIG. 2f, in an embodiment of the present disclosure, the second energy storage unit 321 includes a second MOS transistor MOS2, and the second MOS transistor MOS2 is configured such that both the source and the drain are connected to the voltage node N. The gate is electrically connected to the drain of the third transistor M3, the drain of the fourth transistor M4 and the second terminal 22_2 of the second sub-discharge path 22. The voltage node N is electrically connected to the output terminal of the second controllable voltage output unit 322; wherein the second controllable voltage output unit 322 is configured to provide a controllable voltage to the voltage node N according to the received second sub-control signal CM_SESA<1>, to adjust the driving voltage of the second energy storage unit 321. The second controllable voltage output unit 322 may be configured to include a NOR gate Nor2', and the NOR gate Nor2' is configured: the output terminal is electrically connected to the voltage node N, and the first input terminal is electrically connected to the second sub-control signal CM_SESA<1>, and the second input terminal is electrically connected to both the first sub-discharge path 21 and the second sub-discharge path 22.

Figure 3:
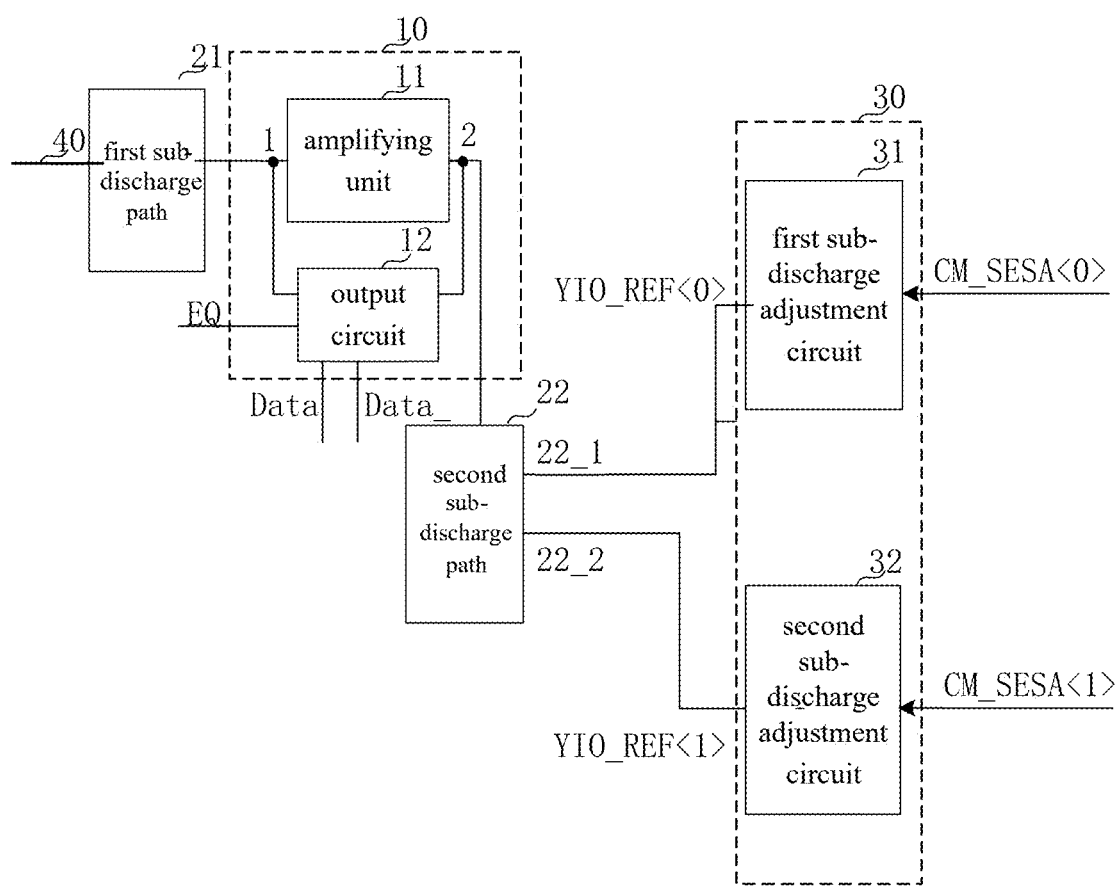
FIG. 3 is a block diagram of a data transmission circuit provided in a fourth embodiment of the present disclosure.

As an example, please refer to FIG. 3, in an embodiment of the present disclosure, the sense amplifier circuit 10 includes an amplifying unit 11 and an output circuit 12, and the amplifying unit 11 is electrically connected to the first sub-discharge path 21 and the second sub-discharge path 22; the output circuit 12 is electrically connected to the equalized signal EQ, the first terminal 1 of the sense amplifier circuit 10, the second terminal 2 of the sense amplifier circuit 10. The sense amplifier circuit 10 is used for outputting the amplified signal to the second data line Data and the second complementary data line Data according to the equalization signal EQ, wherein the second data line Data and the second complementary data line Data transmit mutually inverse data. The amplifying unit 11 is used to amplify the read data, and the output circuit 12 is set to output the amplified comparison result, thereby improving the anti-noise capability of the transmitted data.

Figure 4A:
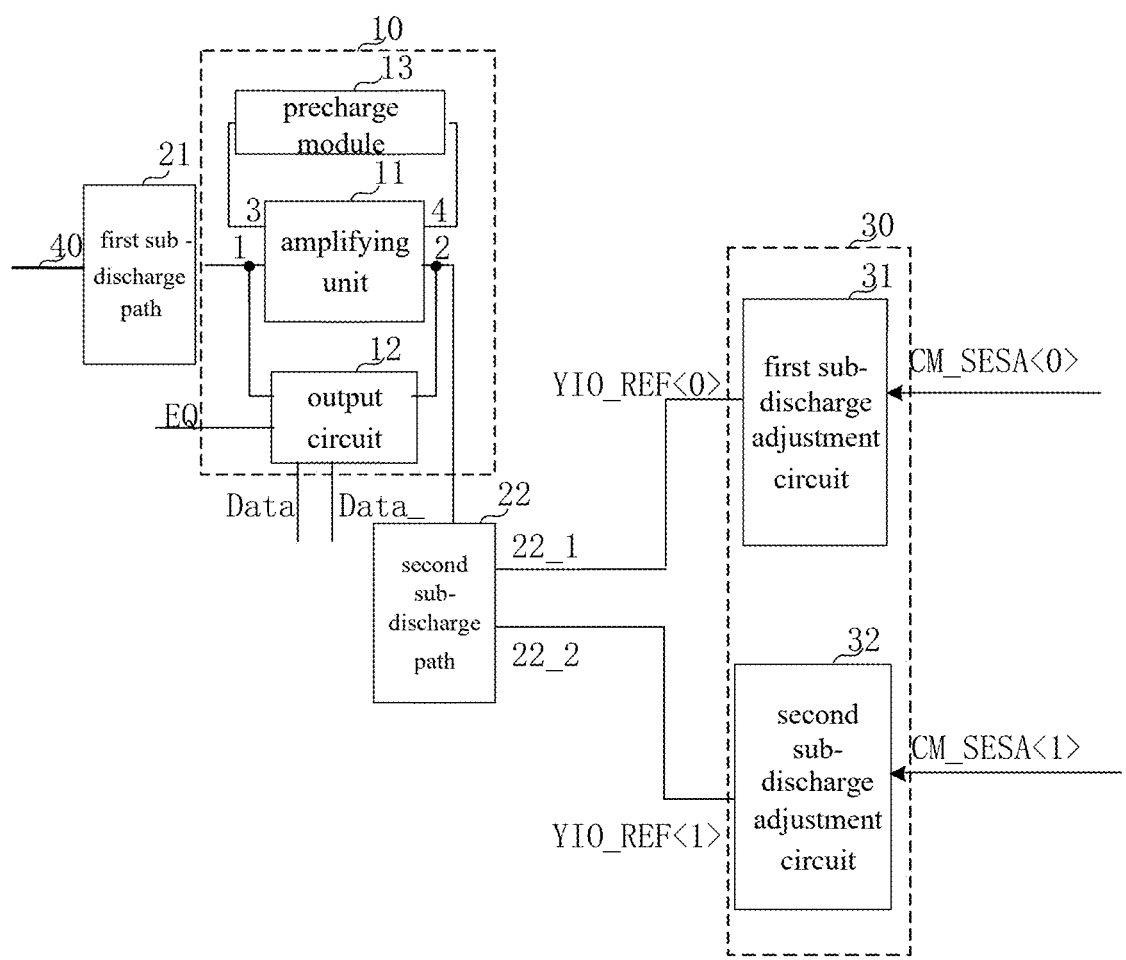
FIG. 4a is a block diagram of a data transmission circuit provided in a fifth embodiment of the present disclosure.

As an example, please refer to FIG. 4a, in one embodiment of the present disclosure, the sense amplifier circuit 10 further includes a precharge module 13, the precharge module 13, the third terminal 3 of the sense amplifier circuit 10 and the fourth terminals 4 of the sense amplifier circuit 10 are all electrically connected for precharging.

Figure 4B:
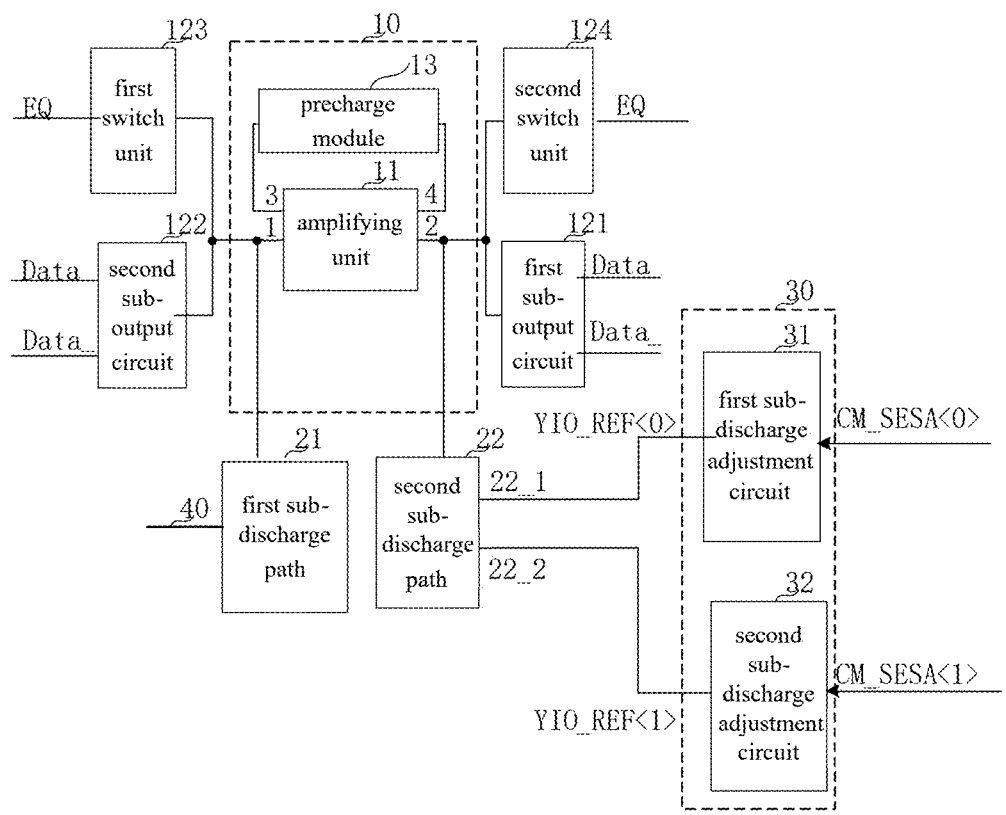
FIG. 4b is a block diagram of a data transmission circuit provided in the sixth embodiment of the present disclosure.

As an example, please refer to FIG. 4b, in an embodiment of the present disclosure, the output circuit 12 further includes a first sub-output circuit 121 and a second sub-output circuit 122. The first sub-output circuit 121, the second terminals 2 of sense amplifier circuit 10, the second data line Data and the second complementary data line Data_ are all electrically connected for outputting the amplified signal; the second sub-output circuit 122 the first terminal 1 of the sense amplifier circuit 10, and the second data line Data of and the second complementary data line Data_ are electrically connected to output the amplified signal and match the output load of the amplifying unit 11.

As an example, please continue to refer to FIG. 4b, in an embodiment of the present disclosure, the output circuit 12 further includes a first switch unit 123 and a second switch unit 124. The first terminal 1 of the sense amplifier circuit 10 is electrically connected to the balanced signal through the first switch unit 123; the second terminal 2 of the sense amplifier circuit 10 is electrically connected to the balanced signal through the second switch unit 124.

Figure 4C:
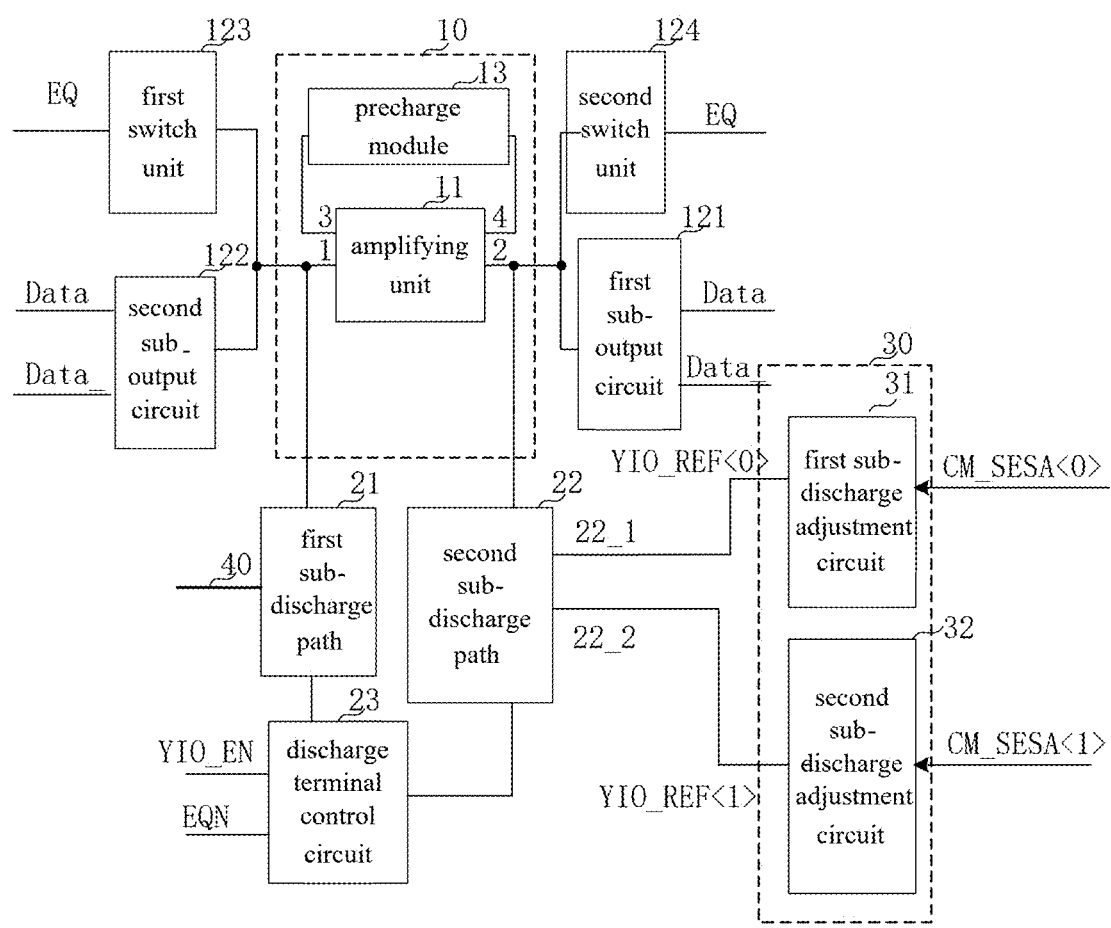
FIG. 4c is a block diagram of a data transmission circuit provided in the seventh embodiment of the present disclosure.

As an example, please refer to FIG. 4c, in an embodiment of the present disclosure, the data transmission circuit further includes a discharge terminal control circuit 23, the discharge terminal control circuit 23 and the discharge terminals of the first sub-discharge path 21 and the second sub-discharge path 22 are electrically connected for providing driving voltages to the first sub-discharge path 21 and the second sub-discharge path 22, according to the received read enable signal YIO_EN and the complementary equalization signal EQN, so as to control the discharge capacity of the first sub-discharge path 21 and the second sub-discharge path 22, wherein the complementary equalization signal EQN and the equalization signal EQ are mutually inverse signals.

Figure 4D:
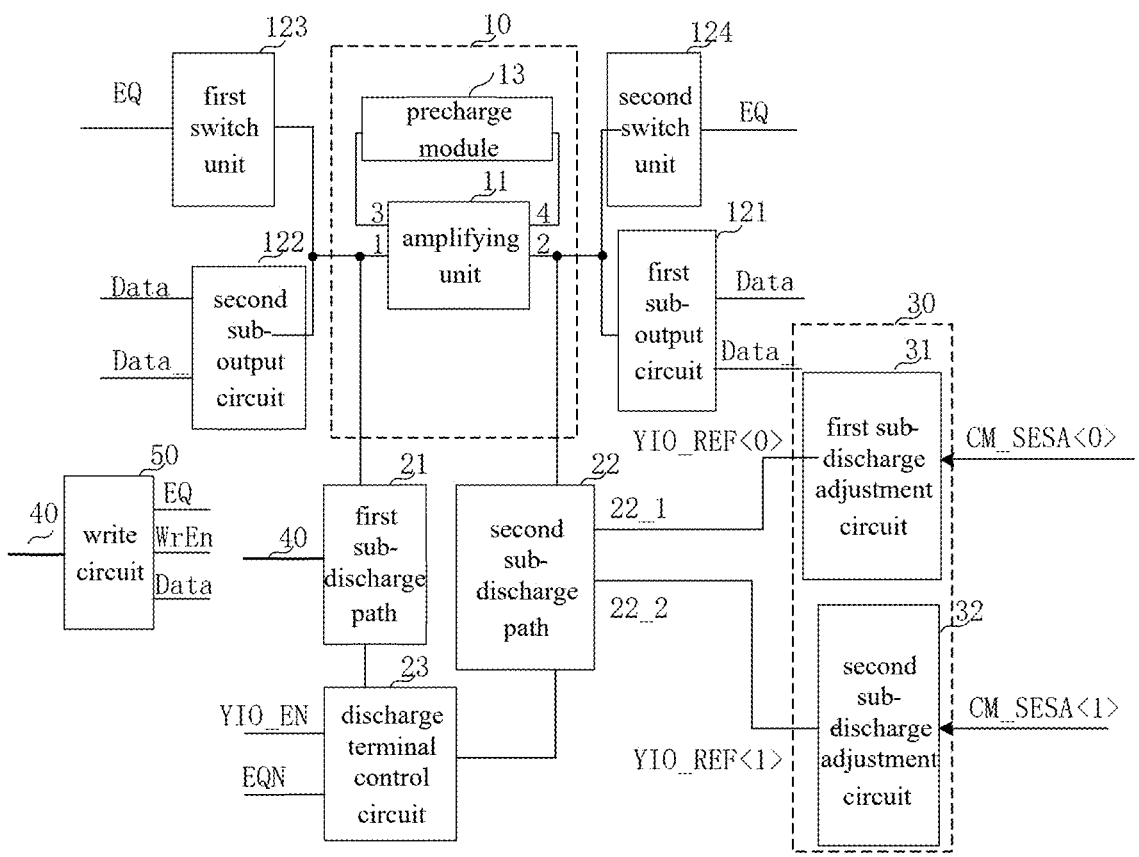
FIG. 4d is a block diagram of a data transmission circuit provided in the eighth embodiment of the present disclosure.

As an example, please refer to FIG. 4d, in an embodiment of the present disclosure, the data transmission circuit further includes a write circuit 50, and the write circuit 50 is electrically connected to the second data line Data, the write enable signal WrEn, the equalization signal EQ and the first data line 40. The write circuit 50 is used for writing data to the first data line 40 according to the write enable signal WrEn and the equalization signal EQ.

Figure 5A:
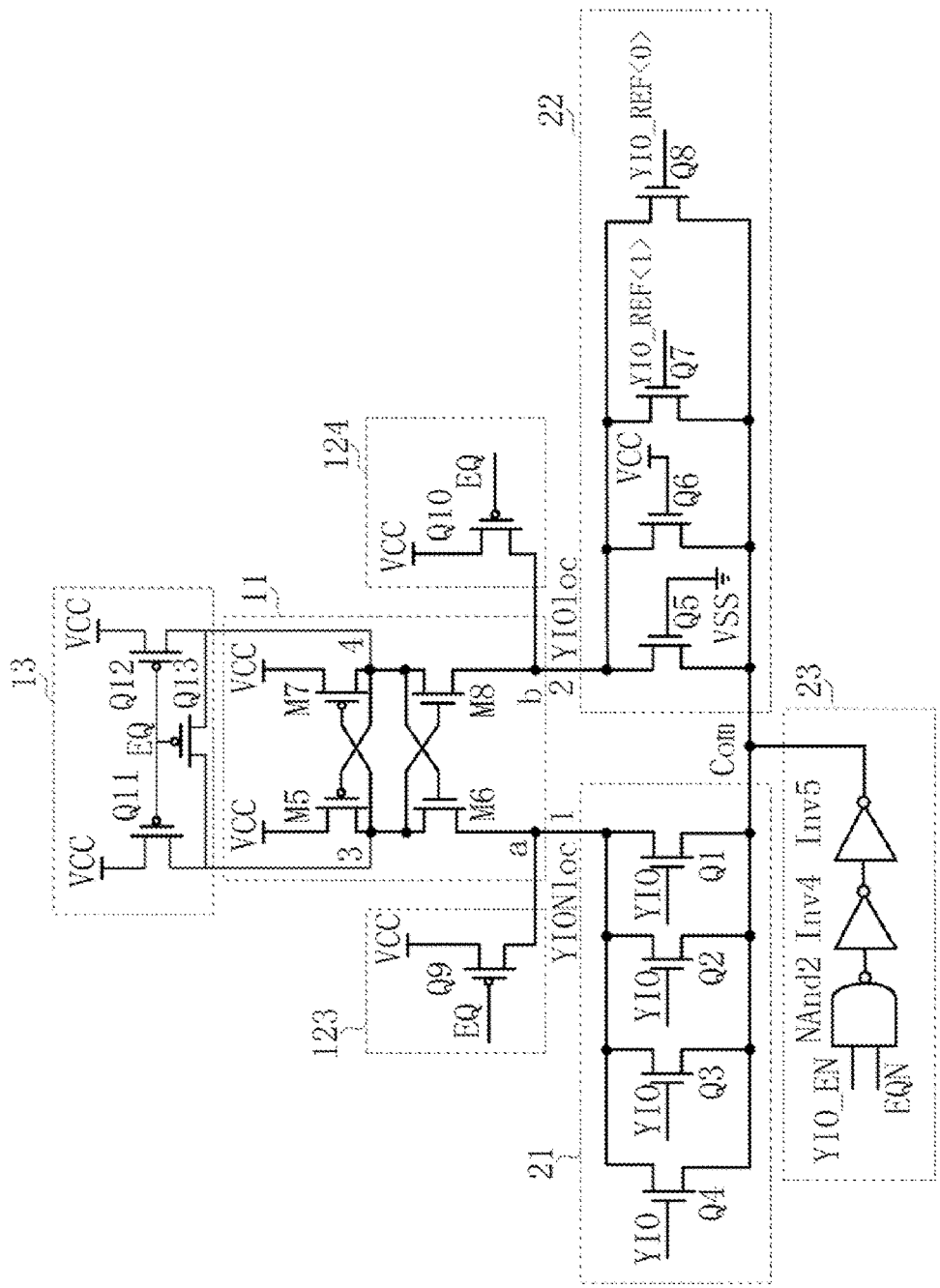
FIG. 5a is a partial schematic diagram of a data transmission circuit provided in an embodiment of the present disclosure.

As an example, please refer to FIG. 5a, in one embodiment of the present disclosure, the amplifying unit 11 includes a fifth transistor M5, a sixth transistor M6, a seventh transistor M7 and an eighth transistor M8, and the fifth transistor M5 is configured as: a source is electrically connected to the third voltage VCC; the sixth transistor M6 is configured as: the source is electrically connected to the second voltage node a, and the drain is electrically connected to the drain of the fifth transistor M5; the seventh transistor M7 is configured as: the source is electrically connected to the third voltage VCC, the drain is electrically connected to the gate of the fifth transistor M5, and the gate is electrically connected to the drain of the fifth transistor M5; the eighth transistor M8 is configured as: the source and the third voltage node b is electrically connected, the drain is electrically connected to the drain of the seventh transistor M7 and the gate of the sixth transistor M6, and the gate is electrically connected to the drain of the fifth transistor M5. A latch is formed by disposing the fifth transistor M5, the sixth transistor M6, the seventh transistor M7 and the eighth transistor M8. The latch can amplify and latch the data read through the first data line 40, e.g., the global data line YIO, and then output it, so as to improve the anti-noise capability of the output data.

As an example, please continue to refer to FIG. 5a, in one embodiment of the present disclosure, the first sub-discharge path 21 includes a transistor Q1, a transistor Q2, a transistor Q3 and a transistor Q4, and the transistor Q1 is configured as a source and a fourth voltage node Com is electrically connected, the drain is electrically connected to the second voltage node a, and the gate is electrically connected to the global data line YIO; the transistor Q2 is configured such that the source is electrically connected to the fourth voltage node Com, and the drain is electrically connected to the second voltage node a, the gate is electrically connected to the global data line YIO; the transistor Q3 is configured such that the source is electrically connected to the fourth voltage node Com, the drain is electrically connected to the second voltage node a, and the gate is electrically connected to the global data line YIO; the transistor Q4 is configured as: the source is electrically connected to the fourth voltage node Com, the drain is electrically connected to the second voltage node a, and the gate is electrically connected to the global data line YIO. The second sub-discharge path 22 includes a transistor Q5, a transistor Q6, a transistor Q7 and a transistor Q8. The transistor Q5 is configured such that the source is electrically connected to the fourth voltage node Com, the drain is electrically connected to the third voltage node b, and the gate is electrically connected to the fourth voltage node Com. The fourth voltage VSS is electrically connected; the transistor Q6 is configured such that the source is electrically connected to the fourth voltage node Com, the drain is electrically connected to the third voltage node b, and the gate is electrically connected to the third voltage VCC; the transistor Q7 is configured to: the source is electrically connected to the fourth voltage node Com, the drain is electrically connected to the third voltage node b, and the gate is electrically connected to the second sub-discharge adjustment signal YIO_REF<1>; the transistor Q8 is configured as: the source is electrically connected to the fourth voltage node Com, and the drain is electrically connected to the third voltage node b, and the gate is electrically connected to the first sub-discharge adjustment signal YIO_REF<0>.

As an example, please continue to refer to FIG. 5a, in one embodiment of the present disclosure, the first switch unit 123 includes a transistor Q9, the second switch unit 124 includes a transistor Q10, and the first terminal 1 of the sense amplifier circuit 10 is connected to the transistor Q9 via the transistor Q10. The equalized signal EQ is electrically connected; the second terminal 2 of the sense amplifier circuit 10 is electrically connected to the equalized signal EQ via the transistor Q10.

As an example, please continue to refer to FIG. 5a, in one embodiment of the present disclosure, the pre-charging module 13 may be configured to include a transistor Q11, a transistor Q12 and a transistor Q13. The transistor Q11 is configured such that the source is electrically connected to the third voltage VCC, the drain is electrically connected to the drain of the fifth transistor M5, and the gate is electrically connected to the equalization signal EQ. The transistor Q12 is configured such that the source is electrically connected to the third voltage VCC, and the drain is electrically connected to the drain of the seventh transistor M7, the gate is electrically connected to the equalization signal EQ. The transistor Q13 is configured such that the source is electrically connected to the drain of the transistor Q12, the drain is electrically connected to the drain of the transistor Q13, and the gate is electrically connected to the equalization signal EQ.

As an example, please continue to refer to FIG. 5a, in one embodiment of the present disclosure, the discharge terminal control circuit 23 includes a NAND gate NAnd2, an inverter Inv4 and an inverter Inv5, and the NAND gate NAnd2 is configured as: the first input terminal is electrically connected to the read enable signal YIO_EN, the second input terminal is electrically connected to the complementary equalization signal EQN; the input terminal of the inverter Inv4 is electrically connected to the output terminal of the NAND gate NAnd2; the input terminal of the inverter Inv5 is electrically connected to the output terminal of the inverter Inv4, and the output terminal of the inverter Inv5 is electrically connected to the fourth voltage node Com.

Figure 5B:
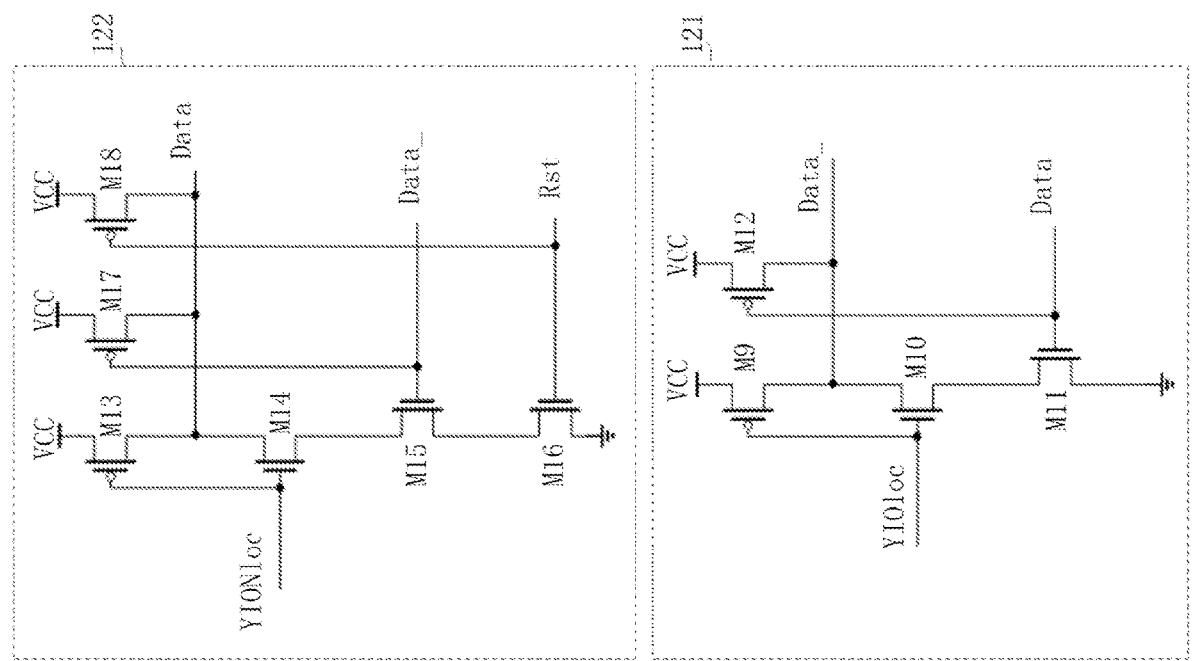
FIG. 5b is a partial schematic diagram of an output circuit in a data transmission circuit provided in an embodiment of the present disclosure.

As an example, please refer to FIG. 5b, in one embodiment of the present disclosure, the first sub-output circuit 121 includes a ninth transistor M9, a tenth transistor M10, an eleventh transistor M11 and a twelfth transistor M12. The ninth transistor M9 is configured as follows: the source is electrically connected to the third voltage VCC, the drain is electrically connected to the second complementary data line Data, and the gate is electrically connected to the drain of the seventh transistor M7; the tenth transistor M10 is configured as: the drain is electrically connected to the drain of the ninth transistor M9, and the gate is electrically connected to the drain of the seventh transistor M7 and the gate of the ninth transistor M9; the eleventh transistor M11 is configured as: the source is grounded, and the drain is electrically to the source of the tenth transistor M10, and the gate is electrically connected to the second data line Data; the twelfth transistor M12 is configured: the source is electrically connected to the third voltage VCC, and the drain is electrically connected to the second complementary data line Data_and the drain of the ninth transistors M9, and the gates is electrically connected to the second data line Data.

As an example, please continue to refer to FIG. 5b, in one embodiment of the present disclosure, the second sub-output circuit 122 includes a thirteenth transistor M13, a fourteenth transistor M14, a fifteenth transistor M15, a sixteenth transistor M16, a seventeenth transistor M17, an eighteenth transistor M18. The thirteenth transistor M13 is configured: the source is electrically connected to the third voltage VCC, the drain is electrically connected to the second data line Data, and the gate is electrically connected to the drain of the fifth transistor M5. The fourteenth transistor M14 is configured such that the drain is electrically connected to the drain of the thirteenth transistor M13, and the gate is electrically connected to the drain of the fifth transistor M5 and the gate of the thirteenth transistor M13; the fifteenth transistor M15 is configured such that the drain is electrically connected to the source of the fourteenth transistor M14, and the gate is electrically connected to the second complementary data line Data; the sixteenth transistor M16 is configured such that the source is grounded and the drain is connected to the ground. The electrode is electrically connected to the source of the fifteenth transistor M15, and the gate is electrically connected to the reset signal Rst; the seventeenth transistor M17 is configured such that the source is electrically connected to the third voltage VCC, and the drain is electrically connected to the second data line Data. connected, the gate is electrically connected to the second complementary data line Data_and the gate of the fifteenth transistor M15; the eighteenth transistor M18 is configured such that the source is electrically connected to the third voltage VCC, and the drain is electrically connected to the second data line Data, and the gate is electrically connected to the reset signal Rst and the gate of the sixteenth transistor M16. In this embodiment, the second data line Data can be set as the local data line LIO, and the second complementary data line Data can be set as the complementary local data line LIO_, wherein the transmission of the local data line LIO and the complementary local data line LIO are mutually Inverted data.

Figure 5C:
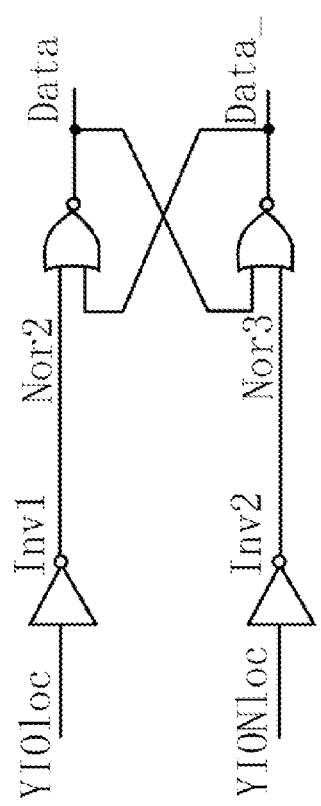
FIG. 5c is a partial schematic diagram of an output circuit in a data transmission circuit provided in another embodiment of the present disclosure.

As an example, please refer to FIG. 5c, in one embodiment of the present disclosure, the output circuit further includes a first inverter Inv1, a second NOR gate Nor2, a second inverter Inv2 and a third NOR gate Nor3. An inverter Inv1 is configured such that the input terminal is electrically connected to the drain of the seventh transistor M7; the second NOR gate Nor2 is configured such that the first input terminal is electrically connected to the output terminal of the first inverter Inv1, the first two input terminals are electrically connected to the second complementary data line Data, and the output terminal is electrically connected to the second data line Data; the second inverter Inv2 is configured such that: the input terminal is electrically connected to the drain of the fifth transistor M5; the third NOR gate Nor3 is configured as: the first input terminal is electrically connected to the second data line Data, the second input terminal is electrically connected to the output terminal of the second inverter Inv2, and the output terminal is electrically connected to the second complementary data line Data_. In this embodiment, the output load of the first terminal 1 of the sense amplifier circuit 10 and the output load of the second terminal 2 of the sense amplifier circuit 10 are more balanced, so as to improve the sensitivity of the sense amplifier circuit 10.

Figure 5D:
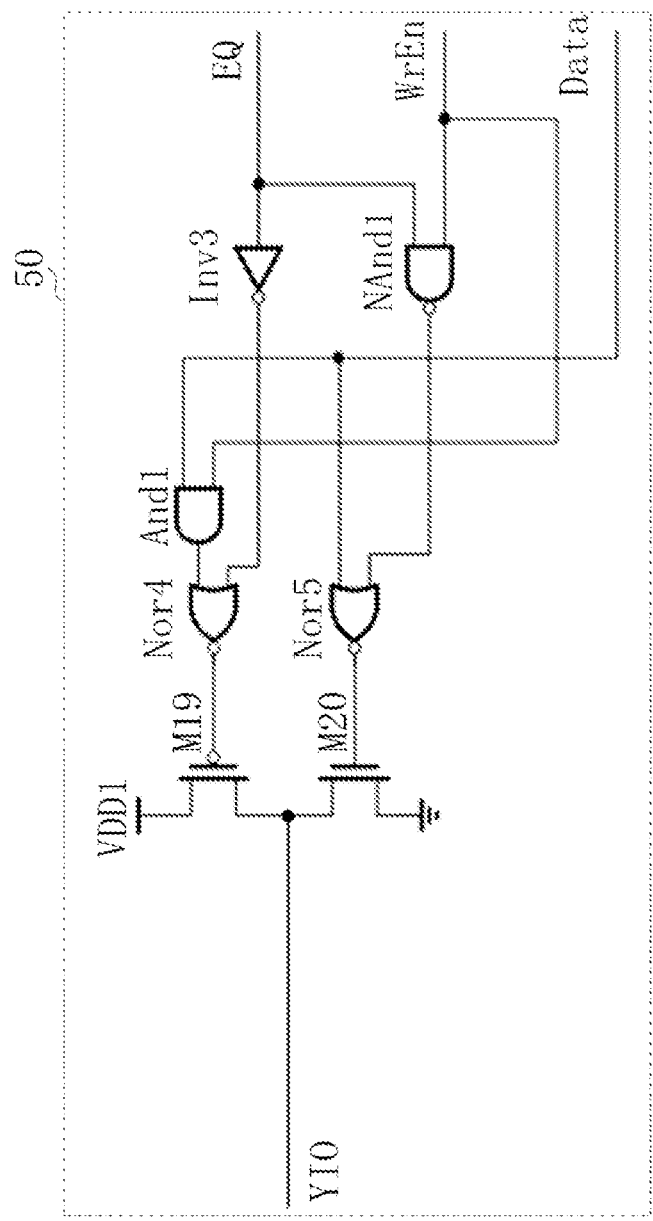
FIG. 5d is a schematic diagram of a write circuit in a data transmission circuit according to an embodiment of the present disclosure.

As an example, please refer to FIG. 5d, in one embodiment of the present disclosure, the writing circuit 50 includes a nineteenth transistor M19, a twentieth transistor M20, a fourth NOR gate Nor4, a fifth NOR gate Nor5, a first NAND gate NAnd1, the first AND gate And1 and the third inverter Inv3, the nineteenth transistor M19 is configured such that the source is electrically connected to the third voltage VCC, and the drain and the first data line 40 are, for example, the global data line YIO electrical connection; the twentieth transistor M20 is configured as: the source is grounded, the drain is electrically connected to the drain of the nineteenth transistor M19 and the first data line 40; the fourth NOR gate Nor4 is configured as: the output terminal is electrically connected to the gate of the nineteenth transistor M19; the fifth NOR gate Nor5 is configured as: the output terminal is electrically connected with the gate of the twentieth transistor M20; the first NAND gate NAnd1 is configured as: the output terminal is connected to the fifth The first input terminal of the NOR gate Nor5 is electrically connected, the first input terminal is electrically connected to the write enable signal, and the second input terminal is electrically connected to the equalization signal; the first AND gate And1 is configured as: the output terminal is electrically connected to the second input terminal of the fourth NOR gate Nor4, the first input terminal is electrically connected with the write enable signal, and the second input terminal is electrically connected with the second input terminal of the fifth NOR gate Nor5 and the second data line Data; the third The inverter Inv3 is configured such that the output terminal is electrically connected to the first input terminal of the fourth NOR gate Nor4, and the input terminal is electrically connected to the equalization signal.

In one embodiment of the present disclosure, a memory is provided, including the data transmission circuit in any of the embodiments of the present disclosure, which can control the discharge adjustment and adjust the discharge capacity of the second sub-discharge path 22 through the control signal CM_SESA, so as to improve data transmission efficiency of the circuit, avoiding the influence of the impedance and noise signal from the circuit connecting the first sub-discharge path 21 to the sense amplifier circuit 10 via the first data line 40.

Note that the above-described embodiments are for illustrative purposes only and are not meant to limit the present invention.

The various embodiments in this specification are described in a progressive manner, and each embodiment focuses on the differences from other embodiments, and the same and similar parts between the various embodiments may be referred to each other.

The technical features of the above-described embodiments can be combined arbitrarily. For the sake of brevity, all possible combinations of the technical features in the above-described embodiments are not described. However, as long as there is no contradiction between the combinations of these technical features, all should be regarded as the scope described in this specification.

The above-mentioned embodiments only represent several embodiments of the present invention, and the descriptions thereof are more specific and detailed, but should not be construed as a limitation on the scope of the invention patent. It should be pointed out that for those skilled in the art, without departing from the concept of the present invention, several modifications and improvements can be made, which all belong to the protection scope of the present invention. Therefore, the protection scope of the patent of the present invention should be subject to the appended claims.

The invention claimed is:

1. A data transmission circuit, comprising:
a sense amplifier circuit, wherein the sense amplifier circuit generates an amplified signal based on a signal at a first terminal and a signal at a second terminal;
a first sub-discharge path, electrically connected to the first terminal and a first data line, wherein the first sub-discharge path discharges from the first terminal to a discharge terminal based on a signal of the first data line in a read state;
a second sub-discharge path, electrically connected to the second terminal and configured to receive a discharge adjustment signal, wherein the second sub-discharge path discharges from the second terminal to the discharge terminal based on the discharge adjustment signal in the reading state; and
a discharge adjustment unit, wherein the discharge adjustment unit is not electrically connected to the first sub-discharge path but is electrically connected to the second sub-discharge path and configured to receive a control signal, wherein the discharge adjustment unit generates the discharge adjustment signal based on the control signal to adjust a discharge capacity of the second sub-discharge path;
wherein the control signal comprises a first sub-control signal, wherein the discharge adjustment signal comprises a first sub-discharge adjustment signal; wherein the discharge adjustment unit comprises:
a first sub-discharge adjustment circuit, electrically connected to a first terminal of the second sub-discharge path and configured to receive the first sub-control signal, wherein the first sub-discharge adjustment circuit provides the first sub-discharge adjustment signal to the second sub-discharge path based on the first sub-control signal;
wherein the control signal further comprises a second sub-control signal, the discharge adjustment signal further comprises a second sub-discharge adjustment signal; and wherein the discharge adjustment unit further comprises:
a second sub-discharge adjustment circuit, electrically connected to a second terminal of the second sub-discharge path and configured to receive the second sub-control signal, wherein the second sub-discharge adjustment circuit is configured to provide the second sub-discharge adjustment signal to the second sub-discharge path based on the second sub-control signal;
wherein the first sub-discharge adjustment circuit comprises:
a first transistor, wherein a source of the first transistor is electrically connected to a first voltage, and a gate is configured to receive the first sub-control signal;
a second transistor, wherein a source of the second transistor is electrically connected to a second voltage, a drain is electrically connected to the drain of the first transistor and the first terminal of the second sub-discharge path, and a gate is configured to receive the first sub-control signal; and
a first energy storage unit, electrically connected to both the drain of the first transistor and the drain of the second transistor.

2. The data transmission circuit of claim 1, wherein the second sub-discharge adjustment circuit comprises:
a third transistor, wherein a source of the third transistor is electrically connected to the first voltage, and a gate of the third transistor is configured to receive the second sub-control signal;
a fourth transistor, wherein a source of the fourth transistor is electrically connected to the second voltage, a drain of the fourth transistor is electrically connected to the drain of the third transistor and the second terminal of the second sub-discharge path, and a gate of the fourth transistor is configured to receive the second sub-control signal; and
a second energy storage unit, wherein the second energy storage unit is electrically connected to the drain of the third transistor and the drain of the fourth transistor.

3. The data transmission circuit according to claim 1, wherein the first energy storage unit comprises:
a first MOS transistor, wherein a source and a drain of the first MOS transistor are both electrically connected to a first voltage node, and a gate of the first MOS transistor is electrically connected to the drain of the first transistor, the drain of the second transistor and the first terminal of the second sub-discharge path; and/or
a capacitor, wherein a first terminal of the capacitor is electrically connected to the first voltage node, a second terminal of the capacitor is electrically connected to the drain of the first transistor, the drain of the second transistor, and the first terminal of the second sub-discharge path.

4. The data transmission circuit of claim 3, wherein:
the first voltage node is grounded; or
the first voltage node is electrically connected to a first controllable voltage output unit;
wherein the first controllable voltage output unit provides a controllable voltage to the first voltage node based on the first sub-control signal.

5. The data transmission circuit according to claim 4, wherein the first controllable voltage output unit comprises:
a first NOR gate, comprising an output terminal electrically connected to the first voltage node, a first input terminal configured to receive the first sub-control signal, and a second input terminal electrically connected to discharging terminals of the first sub-discharge path and the second sub-discharge paths.

6. The data transmission circuit according to claim 1, wherein the sense amplifier circuit comprises:
an amplifying unit, electrically connected to both the discharge terminals of the first sub-discharge path and the second sub-discharge path; and
an output circuit, electrically connected to an equalization signal, a first terminal of the sense amplifier circuit, a second terminal of the sense amplifier circuit, a second data line and a second complementary data line;
wherein the sense amplifier circuit provides the amplified signal to the second data line and the second complementary data line, based on the equalization signal, a signal provided by the first sub-discharge path and a signal provided by the second sub-discharge path, wherein the second data line and the second complementary data line transmit mutually inverse data.

7. The data transmission circuit according to claim 6, wherein the sense amplifier circuit further comprises:
a precharge module, electrically connected to a third terminal of the sense amplifier circuit and a fourth terminal of the sense amplifier circuit, wherein the precharge module performs precharging.

8. The data transmission circuit of claim 7, wherein the output circuit further comprises:
a first sub-output circuit, wherein the first sub-output circuit is electrically connected to the second terminal of the sense amplifier circuit, the second data line and the second complementary data line, for outputting the amplified signal; and
a second sub-output circuit, wherein the second sub-output circuit is electrically connected to the first terminal of the sense amplifier circuit, the second data line and the second complementary data line, for outputting the amplified signal and matching an output load of the amplifying unit.

9. The data transmission circuit of claim 8, wherein the output circuit further comprises:
a first switch unit, wherein the first terminal of the sense amplifier circuit is electrically connected to the equalization signal via the first switch unit; and
a second switch unit, wherein the second terminal of the sense amplifier circuit is electrically connected to the equalization signal via the second switch unit.

10. The data transmission circuit according to claim 1, wherein, further comprising:
a discharge terminal control circuit, wherein the discharge terminal control circuit is electrically connected to discharge terminals of the first sub-discharge path and the second sub-discharge path, for sending a driving voltage to the first sub-discharge path and the second sub-discharge path to control a discharge capacity of the first sub-discharge path and a discharge capacity of the second sub-discharge path, based on a received read enable signal and a complementary equalization signal, wherein the second sub-discharge path wherein the complementary equalization signal and the equalization signal are mutually inverse signals.

11. The data transmission circuit according to claim 1, further comprising a write circuit, wherein the write circuit is electrically connected to the second data line and the first data line, and is configured to receive a write enable signal and the equalization signal, and wherein the write circuit is configured to write data to the first data line based on the write enable signal and the equalization signal.

12. The data transmission circuit of claim 9, wherein the amplifying unit comprises:
a fifth transistor, wherein a source of the fifth transistor is electrically connected to a third voltage;
a sixth transistor, wherein a source of the sixth transistor is electrically connected to a second voltage node, and a drain of the sixth transistor is electrically connected to a drain of the fifth transistor;
a seventh transistor, wherein a source of the seventh transistor is electrically connected to the third voltage, a drain of the seventh transistor is electrically connected to a gate of the fifth transistor, and a gate of the seventh transistor is electrically connected to the drain of the fifth transistor;
an eighth transistor, wherein a source of the eighth transistor is electrically connected to a third voltage node, a drain of the eighth transistor is electrically connected to the drain of the seventh transistor and a gate of the sixth transistor, and a gate of the eighth transistor is electrically connected to the drain of the fifth transistor.

13. The data transmission circuit of claim 12, wherein the first sub-output circuit comprises:
a ninth transistor, wherein a source of the ninth transistor is electrically connected to the third voltage, a drain of the ninth transistor is electrically connected to the second complementary data line, and a gate of the ninth transistor is electrically connected to the drain of the seventh transistor;
a tenth transistor, wherein a drain of the tenth transistor is electrically connected to the drain of the ninth transistor, and a gate of the tenth transistor is electrically connected to the drain of the seventh transistor and the gate of the ninth transistor;
an eleventh transistor, wherein a source of the eleventh transistor is grounded, a drain of the eleventh transistor is electrically connected to a source of the tenth transistor, and a gate of the eleventh transistor is electrically connected to the second data line; and
a twelfth transistor, wherein a source of the twelfth transistor is electrically connected to the third voltage, a drain of the twelfth transistor is electrically connected to the second complementary data line and the drain of the ninth transistor, and a gate of the twelfth transistor is electrically connected to the second data line.

14. The data transmission circuit of claim 13, wherein the second sub-output circuit comprises:
a thirteenth transistor, wherein a source of the thirteenth transistor is electrically connected to the third voltage, a drain of the thirteenth transistor is electrically connected to the second data line, and a gate of the thirteenth transistor is electrically connected to the drain of the fifth transistor;
a fourteenth transistor, wherein a drain of the fourteenth transistor is electrically connected to the drain of the thirteenth transistor, and a gate of the fourteenth transistor is electrically connected to both the drain of the fifth transistor and the gate of the thirteenth transistor;
a fifteenth transistor, wherein a drain of the fifteenth transistor is electrically connected to a source of the fourteenth transistor, and a gate of the fifteenth transistor is electrically connected to the second complementary data line;
a sixteenth transistor, wherein a source of the sixteenth transistor is grounded, a drain of the sixteenth transistor is electrically connected to a source of the fifteenth transistor, and a gate of the sixteenth transistor is configured to receive a reset signal;
a seventeenth transistor, wherein a source of the seventeenth transistor is electrically connected to the third voltage, a drain of the seventeenth transistor is electrically connected to the second data line, and a gate of the seventeenth transistor is electrically connected to the second complementary data line and the gate of the fifteenth transistor; and
an eighteenth transistor, wherein a source of the eighteenth transistor is electrically connected to the third voltage, a drain of the eighteenth transistor is electrically connected to the second data line, and a gate of the eighteenth transistor is connected to the gate of the sixteenth transistor and configured to receive the reset signal.

15. The data transmission circuit of claim 12, wherein the output circuit further comprises:

a first inverter, wherein an input terminal of the first inverter is electrically connected to the drain of the seventh transistor;

a second NOR gate, wherein a first input terminal of the second NOR gate is electrically connected to an output terminal of the first inverter, a second input terminal of the second NOR gate is electrically connected to the second complementary data line, and an output terminal of the second NOR gate is electrically connected to the second data line;

a second inverter, wherein an input terminal of the second inverter is electrically connected to the drain of the fifth transistor; and a third NOR gate, wherein a first input terminal of the third NOR gate is electrically connected to the second data line, a second input terminal of the third NOR gate is electrically connected to an output terminal of the second inverter, and an output terminal of the third NOR gate is electrically connected to the second complementary data line.

16. The data transfer circuit of claim 11, wherein the write circuit comprises:

a nineteenth transistor, wherein a source of the nineteenth transistor is electrically connected to the third voltage, and a drain of the nineteenth transistor is electrically connected to the first data line;

a twentieth transistor, wherein a source of the twentieth transistor is grounded, and a drain of the twentieth transistor is electrically connected to both the drain of the nineteenth transistor and the first data line;

a fourth NOR gate, wherein an output terminal of the fourth NOR gate is electrically connected to a gate of the nineteenth transistor;

a fifth NOR gate, wherein an output terminal of the fifth NOR gate is electrically connected to a gate of the twentieth transistor;

a first NAND gate, wherein an output terminal of the first NAND gate is electrically connected to the first input terminal of the fifth NOR gate, the first input terminal of the first NAND gate is electrically connected to the write enable signal, and the second input terminal of the first NAND gate is configured to receive the equalization signal;

a first AND gate, wherein an output terminal of the first AND gate is electrically connected to the second input terminal of the fourth NOR gate, the first input terminal of the first AND gate is configured to receive the write enable signal, and the second input terminal of the first AND gate is electrically connected to a second input terminal of the fifth NOR gate and the second data line; and a third inverter, wherein an output terminal of the third inverter is electrically connected to a first input terminal of the fourth NOR gate, and an input terminal of the third inverter is configured to receive the equalization signal.

17. A memory comprising the data transfer circuit of claim 1.

18. A data transmission circuit, comprising:

a sense amplifier circuit, wherein the sense amplifier circuit generates an amplified signal based on a signal at a first terminal and a signal at a second terminal;

a first sub-discharge path, electrically connected to the first terminal and a first data line, wherein the first sub-discharge path discharges from the first terminal to a discharge terminal based on a signal of the first data line in a read state;

a second sub-discharge path, electrically connected to the second terminal and configured to receive a discharge adjustment signal, wherein the second sub-discharge path discharges from the second terminal to the discharge terminal based on the discharge adjustment signal in the reading state; and a discharge adjustment unit, wherein the discharge adjustment unit is not electrically connected to the first sub-discharge path but is electrically connected to the second sub-discharge path and configured to receive a control signal, wherein the discharge adjustment unit generates the discharge adjustment signal based on the control signal to adjust a discharge capacity of the second sub-discharge path;

a discharge terminal control circuit, wherein the discharge terminal control circuit is electrically connected to discharge terminals of the first sub-discharge path and the second sub-discharge path, for sending a driving voltage to the first sub-discharge path and the second sub-discharge path to control a discharge capacity of the first sub-discharge path and a discharge capacity of the second sub-discharge path, based on a received read enable signal and a complementary equalization signal, wherein the second sub-discharge path wherein the complementary equalization signal and the equalization signal are mutually inverse signals.

19. A data transmission circuit, comprising:

a sense amplifier circuit, wherein the sense amplifier circuit generates an amplified signal based on a signal at a first terminal and a signal at a second terminal;

a first sub-discharge path, electrically connected to the first terminal and a first data line, wherein the first sub-discharge path discharges from the first terminal to a discharge terminal based on a signal of the first data line in a read state;

a second sub-discharge path, electrically connected to the second terminal and configured to receive a discharge adjustment signal, wherein the second sub-discharge path discharges from the second terminal to the discharge terminal based on the discharge adjustment signal in the reading state; and a discharge adjustment unit, wherein the discharge adjustment unit is not electrically connected to the first sub-discharge path but is electrically connected to the second sub-discharge path and configured to receive a control signal, wherein the discharge adjustment unit generates the discharge adjustment signal based on the control signal to adjust a discharge capacity of the second sub-discharge path;

a write circuit, wherein the write circuit is electrically connected to the second data line and the first data line, and is configured to receive a write enable signal and the equalization signal, and wherein the write circuit is configured to write data to the first data line based on the write enable signal and the equalization signal.

* * * * *